(12) United States Patent
Fang et al.

(10) Patent No.: US 9,419,612 B2
(45) Date of Patent: Aug. 16, 2016

(54) TOUCH PANEL

(71) Applicant: WINTEK CORPORATION, Taichung (TW)

(72) Inventors: Chong-Yang Fang, Taichung (TW); Wen-Chun Wang, Taichung (TW)

(73) Assignee: WINTEK CORPORATION, Taichung (TW)

( * ) Notice: Subject to any disclaimer, the term of this patent is extended or adjusted under 35 U.S.C. 154(b) by 0 days.

(21) Appl. No.: 14/485,778

(22) Filed: Sep. 14, 2014

(65) Prior Publication Data
US 2015/0075958 A1 Mar. 19, 2015

(30) Foreign Application Priority Data
Sep. 14, 2013 (TW) .............................. 102133384 A

(51) Int. Cl.
H01H 13/70 (2006.01)
H01H 25/00 (2006.01)
H01H 25/04 (2006.01)
H03K 17/96 (2006.01)

(52) U.S. Cl.
CPC .... *H03K 17/9622* (2013.01); *H03K 2017/9602* (2013.01); *H03K 2017/9613* (2013.01); *H03K 2217/96031* (2013.01); *H03K 2217/960755* (2013.01)

(58) Field of Classification Search
CPC ............... H01H 1/00; H01H 13/70; H01H 13/702–13/704; H01H 2203/008; H01H 2207/01; H01H 2221/00; H01H 2231/002; H01H 2231/012; H01H 2231/016; H01H 2231/052; H01H 2239/006; H01H 25/00; H01H 25/04; H01H 2239/074
USPC ..... 200/5 R, 600, 46, 5 A, 292, 243; 345/173
See application file for complete search history.

(56) References Cited

U.S. PATENT DOCUMENTS

| 6,297,811 | B1 * | 10/2001 | Kent ........................ G06F 3/044 178/18.01 |
| 8,599,150 | B2 * | 12/2013 | Philipp ................... G06F 3/044 178/18.01 |
| 2007/0176608 | A1 * | 8/2007 | Mackey ............... G01D 5/2415 324/660 |
| 2009/0315854 | A1 * | 12/2009 | Matsuo ................. G06F 3/0412 345/174 |
| 2014/0015769 | A1 * | 1/2014 | Lee .......................... H01H 9/04 345/173 |

* cited by examiner

*Primary Examiner* — Renee Luebke
*Assistant Examiner* — Anthony R. Jiminez
(74) *Attorney, Agent, or Firm* — Ming Chow; Sinorica, LLC

(57) ABSTRACT

A touch panel includes a first substrate and a plurality of conductive electrodes. The conductive electrodes are located at the first substrate, and each of the conductive electrodes includes at least one mesh electrode. Each of the mesh electrodes includes a plurality of conductive patterns, and the conductive patterns of the same mesh electrode are connected together. Each of the conductive patterns has a central point, and distances from the central point of each of the conductive patterns to the central points of adjacent conductive patterns are incongruent, such that the conductive patterns are arranged in an irregular manner.

19 Claims, 7 Drawing Sheets

TOUCH PANEL

CROSS-REFERENCE TO RELATED APPLICATION

This application claims the priority benefit of Taiwan application serial no. 102133384, filed on Sep. 14, 2013. The entirety of the above-mentioned patent application is hereby incorporated by reference herein and made a part of this specification.

BACKGROUND OF THE INVENTION

1. Field of the Invention

The invention relates to a touch panel; more particularly, the invention relates to a touch panel with mesh electrodes.

2. Description of Related Art

In recent years, as information technology, wireless mobile communication, and info nation appliances have been rapidly developed and applied, various information products have utilized touch panels as input devices in replacement of conventional input devices, e.g., keyboards or mice, so as to satisfy the requirements for convenience, compactness, and the user-friendly design of the information products. Based on different sensing types, touch panels can be generally categorized into resistive touch panels, capacitive touch panels, optical touch panels, acoustic-wave touch panels, and electromagnetic touch panels. Compared to other types of touch panels, the capacitive touch panels characterized by short response time, satisfactory reliability, and high definition have been extensively applied to various hand-held electronic devices.

According to the existing touch sensing techniques, a transparent electrode may be made of a transparent conductive material (e.g., indium tin oxide, ITO); moreover, a mesh electrode may be made of a metal conductive material. In general, the mesh electrodes in a touch panel have specific shape and periods, e.g., hexagonal mesh patterns or rectangular mesh patterns with uniform size. When said touch panel is applied to a display device, the mesh electrodes in the touch panel and the pixel structure with the specific period in the display device are overlapped, such that pale and dark lines are generated, i.e., the display device may encounter the issue of moire. The pale and dark lines are apt to be perceived by users of the display device, thus posing a negative impact on the visual effects of the display device.

At present, some techniques may be applied to resolve the issue of moire occurring in the touch panel having the mesh electrodes, such as adjustment of the period of the mesh electrodes or rotation of the mesh electrodes with respect to the pixel structure of the display device. However, said techniques need be modified for individual display devices with different pixel dimensions, and the modification does not necessarily guarantee the reduction of moire.

SUMMARY OF THE INVENTION

The invention is directed to a touch panel capable of reducing moire.

In an embodiment of the invention, a touch panel that a first substrate and a plurality of conductive electrodes is provided. The conductive electrodes are located at the first substrate, and each of the conductive electrodes includes at least one of mesh electrodes. Each of the mesh electrodes includes a plurality of conductive patterns, and the conductive patterns of the same mesh electrode are connected together. Each of the conductive patterns has a central point, and distances from the central point of each of the conductive patterns to the central points of other adjacent conductive patterns are incongruent, such that the conductive patterns are arranged in an irregular manner.

According to an embodiment of the invention, the conductive electrodes further include a plurality of first conductive electrodes and a plurality of second conductive electrodes. The first conductive electrodes are located on one side of the first substrate, and each of the first conductive electrodes includes the mesh electrodes arranged along a first direction and connected together. The second conductive electrodes are located on one side of the first substrate, and each of the second conductive electrodes includes the mesh electrodes arranged along a second direction and connected together. Here, the mesh electrodes of the first conductive electrodes are electrically insulated from the mesh electrodes of the second conductive electrodes.

According to an embodiment of the invention, each of the conductive patterns is a circular ring or an arc-shaped line segment.

According to an embodiment of the invention, the conductive patterns are overlapped or tangent to each other or one another.

According to an embodiment of the invention, a radius of each of the conductive patterns and radii of other adjacent conductive patterns are equal.

According to an embodiment of the invention, a radius of each of the conductive patterns is different from at least one of radii of other adjacent conductive patterns.

According to an embodiment of the invention, the mesh electrodes of each of the first conductive electrodes are electrically insulated from the adjacent mesh electrodes of the second conductive electrodes through the conductive patterns therebetween are cut off.

According to an embodiment of the invention, the mesh electrodes of each of the first conductive electrodes are electrically insulated from the adjacent mesh electrodes of the second conductive electrodes through the orthogonal projections of the conductive patterns therebetween on the first substrate are not overlapped.

According to an embodiment of the invention, the first conductive electrodes and the second conductive electrodes are located on the same side of the first substrate.

According to an embodiment of the invention, the first conductive electrodes and the second conductive electrodes are located on the same surface of the first substrate, and the first conductive electrodes are electrically insulated from the second conductive electrodes.

According to an embodiment of the invention, the touch panel further includes an insulation pattern. The mesh electrodes arranged in the same direction are electrically insulated, and a connection line between any two adjacent mesh electrodes of the mesh electrodes connects two adjacent mesh electrodes along the same direction. The insulation pattern is located between the first conductive electrodes and second conductive electrodes, and the connection line is located on the insulation pattern and connected to the mesh electrodes arranged in the same direction.

According to an embodiment of the invention, the connection line is a linear connection line or a chain-shaped connection line constituted by a plurality of conductive patterns connected together.

According to an embodiment of the invention, the touch panel further includes an insulation layer that is located between the first conductive electrodes and the second conductive electrodes.

According to an embodiment of the invention, an orthogonal projection of each of the mesh electrodes of each of the first conductive electrodes on the first substrate and an orthogonal projection of the adjacent one of the mesh electrodes of one of the second conductive electrodes on the first substrate has an overlapping portion, and each of the conductive patterns adjacent to the overlapping portion is an arc-shaped line segment.

According to an embodiment of the invention, the mesh electrodes corresponding to the overlapping portion further include a plurality of dummy line segments located on one side of the conductive patterns corresponding to the overlapping portion, and the dummy line segments and the conductive patterns correspondingly constitute a plurality of circular rings.

According to an embodiment of the invention, the first conductive electrodes and the second conductive electrodes are located on two respective sides of the first substrate.

According to an embodiment of the invention, the touch panel further includes a second substrate and an adhesive layer. The second substrate is located on one side of the first substrate, and the first conductive electrodes and the second conductive electrodes are located on two respective surfaces of the first substrate. The adhesive layer is located between the first substrate and the second substrate.

According to an embodiment of the invention, the touch panel further includes a second substrate and an adhesive layer. The second substrate is located on one side of the first substrate. Here, the first conductive electrodes are located on one surface of the first substrate; the second conductive electrodes are located on one surface of the second substrate facing the other surface of the first substrate where the first conductive electrodes are not located. The adhesive layer is located between the first substrate and the second substrate.

According to an embodiment of the invention, the touch panel further includes a third substrate and an adhesive layer. The third substrate is located on one side of the second substrate opposite to the first substrate. The adhesive layer is located between the third substrate and the second substrate.

According to an embodiment of the invention, the touch panel further includes a third substrate and an adhesive layer. The third substrate is located on one side of the first substrate opposite to the second substrate. The adhesive layer is located between the third substrate and the first substrate.

According to an embodiment of the invention, a material of the conductive patterns includes conductive metal, conductive ink, carbon nano-tubes, grapheme, metal nano-particles, metal nano-wires, or a combination thereof.

According to an embodiment of the invention, a wire width of each of the conductive patterns is within a range from 0.5 micrometers ($\mu m$) to 20 micrometers ($\mu m$).

According to an embodiment of the invention, the first substrate is a substrate of a display.

In view of the above, the conductive electrodes of the touch panel described herein are constituted by the mesh electrodes connected together. Each of the mesh electrodes includes a plurality of conductive patterns, each of the conductive patterns has a central point, and the distances from the central point of each of the conductive patterns to the central points of other adjacent conductive patterns are incongruent, such that the conductive patterns are arranged in an irregular manner. When the touch panel described herein is applied to a display device, the pale and dark lines occur by the irregularly arranged conductive patterns of the touch panel overlapping with the pixel structure having the specific period in the display device would be decreased, so as to prevent the effect of moire occurred in the display device. Thereby, the touch panel described herein may not be subject to the problem of moire.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
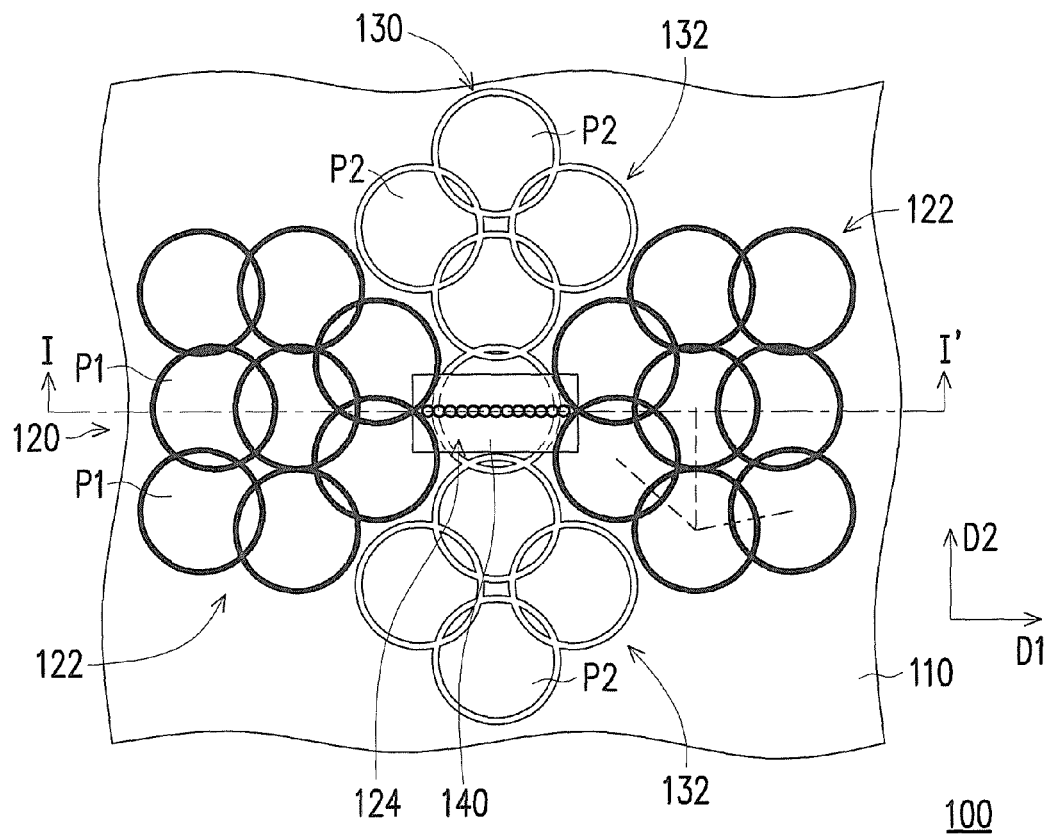
FIG. 1 is a schematic view illustrating a touch panel according to an embodiment of the invention.
Figure 2:
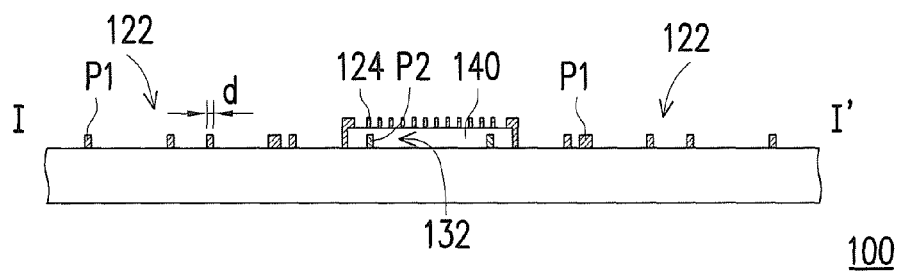
FIG. 2 is a cross-sectional view illustrating the touch panel depicted in FIG. 1 along a line I-I'.

FIG. 1 is a schematic view illustrating a touch panel according to an embodiment of the invention. FIG. 2 is a cross-sectional view illustrating the touch panel depicted in FIG. 1 along a line I-I'. With reference to FIG. 1 and FIG. 2, in the present embodiment, the touch panel 100 includes a first substrate 110, a plurality of first conductive electrodes 120, and a plurality of second conductive electrodes 130. The first conductive electrodes 120 are located on one side of the first substrate 130, and the second conductive electrodes 130 are located on one side of the first substrate 130. Besides, the first conductive electrodes 120 are electrically insulated from the second conductive electrodes 130. To clearly illustrate the embodiment of the invention, a portion of one of the first conductive electrodes 120 and a portion of one of the second conductive electrodes 130 are schematically shown in FIG. 1 and FIG. 2. Here, the first conductive electrode 120 is shown by bold lines, and the second conductive electrode 130 is shown by hollow lines. As a matter of fact, the touch panel 100 has the first conductive electrodes 120 arranged in parallel and the second conductive electrodes 130 arranged in parallel, such that the touch-control function may be provided by means of the variation in mutual capacitance between the first conductive electrodes 120 and the second conductive electrodes 130 or by means of the variation in self capacitance generated by the first/second conductive electrodes 120/130 and the reference potential.

In the present embodiment, each of the first conductive electrodes 120 includes a plurality of mesh electrodes 122 arranged along a first direction D1 and connected together; each of the second conductive electrodes 130 includes a plurality of mesh electrodes 132 arranged along a second direction D2 and connected together. Here, the second direction D2 intersects the first direction D1, and the mesh electrodes 122 of the first conductive electrodes 120 are electrically insulated from the mesh electrodes 132 of the second conductive electrodes 130. Each of the mesh electrodes 122 of the first conductive electrodes 122 includes a plurality of conductive patterns P1, and the conductive patterns P1 of the same mesh electrode 122 are connected together, such that all parts of each mesh electrode 122 are all electrically connected. Similarly, each of the mesh electrodes 132 of the second conductive electrodes 130 includes a plurality of conductive patterns P2, and the conductive patterns P2 of the same mesh electrode 132 are connected together, such that all parts of each mesh electrode 132 are all electrically connected.

Besides, in the present embodiment, the mesh electrodes arranged along one of the two directions are electrically insulated and are not in physical contact, while the mesh electrodes arranged along the other one of the two directions are electrically connected. For instance, as shown in FIG. 1 and described in the present embodiment, the mesh electrodes 122 of the first conductive electrode 120 arranged along the first direction D1 are not in physical contact with each other/one another and are located at two respective sides of the second conductive electrode 130; the mesh electrodes 132 of the second conductive electrode 130 arranged along the second direction D2 are electrically connected through one of the conductive patterns P2 corresponding to any two of the adjacent mesh electrodes 132. Since the first conductive electrodes 120 are extended along the first direction D1, and the second conductive electrodes 130 are extended along the second direction D2, the orthogonal projection of each first conductive electrode 120 on the first substrate 110 intersects the orthogonal projection of each second conductive electrode 130 on the first substrate 110. Since the mesh electrodes of the conductive electrodes (e.g., the first conductive electrodes 120) extending along one of the two directions are electrically insulated and located at two sides of the other conductive electrodes (e.g., the second conductive electrodes 130), the orthogonal projections of the intersections of the first conductive electrodes 120 and the second conductive electrodes 130 on the first substrate 110 are not overlapped, and the touch-sensing result is thus not affected by the interference between the mesh electrodes 122 and the mesh electrodes 132.

In view of the above, a connection line 124 between any two adjacent mesh electrodes 122 of the first conductive electrodes 120 connects two adjacent mesh electrodes 122 along the same direction (e.g., the first direction D1), such that the separated mesh electrodes 122 may be electrically connected along the first direction D1, and that all parts of each of the first conductive electrodes 120 are electrically connected. That is, in the present embodiment, each of the first conductive electrodes 120 is constituted by the mesh electrodes 122 arranged along the first direction D1 and the connection lines 124 each connecting any two adjacent mesh electrodes 122 along the first direction D1, and each of the second conductive electrodes 130 is constituted by the mesh electrodes 132 arranged along the second direction D2 and connected together, as shown in FIG. 1. However, in other embodiments of the invention, each of the first conductive electrodes may be constituted by the mesh electrodes arranged along the first direction, and each of the second conductive electrodes may be constituted by the mesh electrodes arranged along the second direction and the connection lines each connecting any two adjacent mesh electrodes along the second direction; alternatively, each of the first conductive electrodes is constituted by serially connected mesh electrodes and connection lines, and so is each second conductive electrode. The invention should not be limited to those provided in said embodiments.

According to the present embodiment, the first conductive electrodes 120 and the second conductive electrodes 130 are located on the same side of the first substrate 110. To be specific, the first conductive electrodes 120 and the second conductive electrodes 130 are located on the same surface of the first substrate 110, as shown in FIG. 2, and the first conductive electrodes 120 are electrically insulated from the second conductive electrodes 130. Although the mesh electrodes 122 of the first conductive electrodes 120 are electrically insulated from the mesh electrodes 132 of the second conductive electrodes 130, and the orthogonal projections of the mesh electrodes 122 on the first substrate 110 are not overlapped with the orthogonal projections of the mesh electrodes 132 on the first substrate 110, the connection lines each connecting any two adjacent mesh electrodes 122 of the first conductive electrodes 120 may be overlapped with the mesh electrodes 132 of the second conductive electrodes 130. Therefore, the touch panel 100 described in the present embodiment further includes an insulation pattern 140 located between the first conductive electrodes 120 and the second conductive electrodes 130, such that the first conductive electrodes 120 and the second conductive electrodes 130 are electrically insulated. At this time, the insulation pattern 140 is located between the first conductive electrodes 120 and the second conductive electrodes 130, and the connection line 124 is located on the insulation pattern 140 and connected to the mesh electrodes 122 arranged in the same direction (i.e., the first direction D1). Besides, in the present embodiment, the connection line 124 is a chain-shaped connection line constituted by a plurality of conductive patterns P1 electrically connected together, such that every two adjacent mesh electrodes 122 are serially connected, and that all parts of each of the first conductive electrodes 120 are electrically connected. Since the mesh electrodes 122 and the connection lines 124 of the first conductive electrodes 120 are constituted by the conductive patterns P1, the mesh electrodes 122 and the connection lines 124 may be formed by performing the same manufacturing process (e.g., with use of the same photomask). However, in another embodiment of the invention, the connection line may also be a linear connection line, and the type of the connection line is not limited in the invention.

With reference to FIG. 1 and FIG. 2, in the present embodiment, each of the conductive patterns P1 and P2 is a circular ring, and each of the mesh electrodes 122 and 132 is constituted by a plurality of circular rings shaped in a mesh manner. A material of the conductive patterns P1 and P2 includes conductive metal, conductive ink, carbon nano-tubes, grapheme, metal nano-particles, metal nano-wires, or a combination thereof, and a wire width d of each of the conductive patterns P1 and P2 is within a range from 0.5 μm to 20 μm; note that the material and the wire dimension of the conductive patterns P1 and P2 are not limited in the invention. In the present embodiment, each of the conductive patterns P1 and P2 has a central point, and distances from the central point of each of the conductive patterns P1 and P2 to the central points of the adjacent conductive patterns P1 and P2 are incongruent, such that the conductive patterns P1 and P2 are arranged in an irregular manner. Particularly, in the mesh electrodes 122 of the first conductive electrode 120 at the right-hand side, as shown in FIG. 1, the distances from the central point of one of the conductive patterns P1 to the central points of other three adjacent conductive patterns P1 are incongruent, such that the conductive patterns P1 of the mesh electrodes 122 are arranged in an irregular manner. In the present embodiment, the reason why the distances from the central point of each conductive pattern P1 to the central points of other conductive patterns P1 are incongruent lies in that the conductive patterns P1 are designed to be overlapped or tangent to each other or one another. Besides, the conductive patterns P1 are overlapped to different extents; therefore, the distances from the central point of each conductive pattern P1 to the central points of other conductive patterns P1 are incongruent.

Similarly, in the mesh electrodes 132 of the second conductive electrode 130, the distances from the central point of each of the conductive patterns P2 to the central points of other adjacent conductive patterns P2 are incongruent, such that the conductive patterns P2 of each mesh electrode 132 are arranged in an irregular manner. Besides, even though the mesh electrodes 122 and the adjacent mesh electrodes 132 are electrically insulated, the conductive patterns P1 and P2 of the adjacent mesh electrodes 122 and 132 are also characterized by the irregular arrangement, e.g., the distances from the central point of one of the conductive patterns P1 of one of the mesh electrodes 122 adjacent to the mesh electrode 132 to the central points of other adjacent conductive patterns P1 and P2 are incongruent, such that the conductive patterns P1 and P2 are arranged in an irregular manner. Accordingly, when the touch panel 100 is applied to a display device (not shown), the pale and dark lines occur by the irregularly arranged conductive patterns P1 and P2 of the touch panel 100 overlapping with the pixel structure having the specific period in the display device would be decreased, so as to prevent the effect of moire occurred in the display device.

Figure 3A:
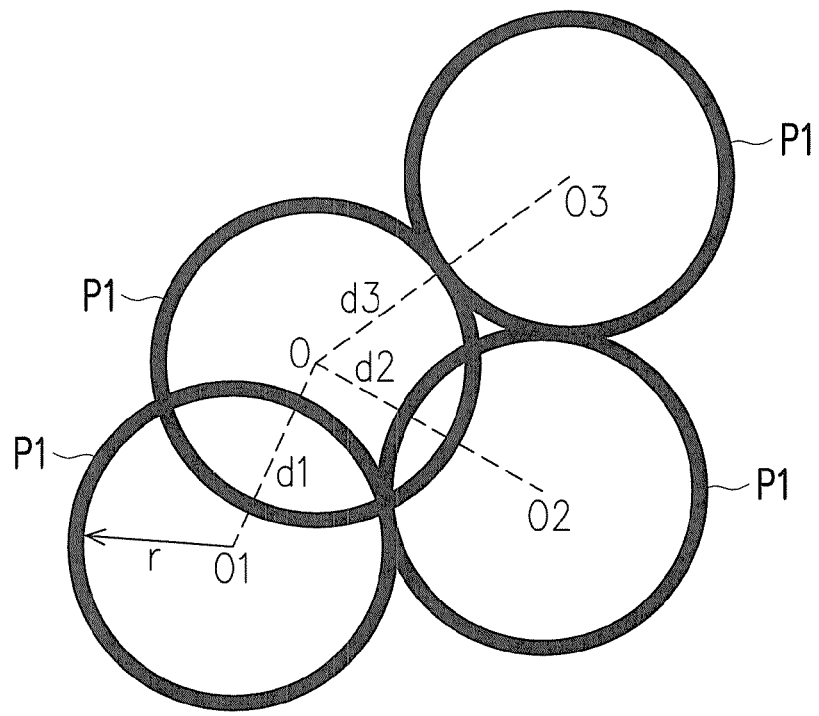
FIG. 3A to FIG. 3D are schematic views illustrating the conductive patterns depicted in FIG. 1 according to several embodiments of the invention.
Figure 3B:
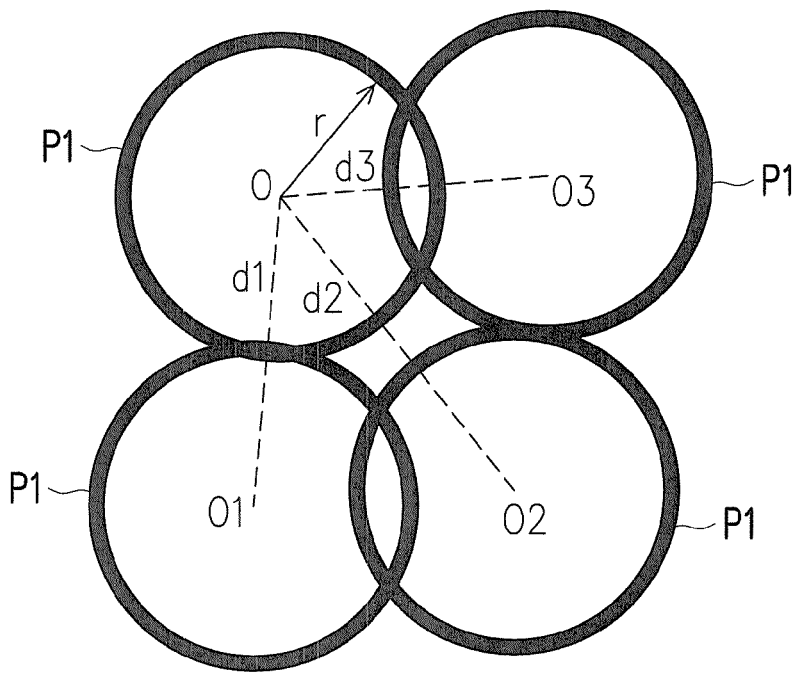

FIG. 3A to FIG. 3D are schematic views illustrating the conductive patterns depicted in FIG. 1 according to several embodiments of the invention. With reference to FIG. 3A, in the embodiment shown therein, the conductive patterns P1 are circular rings, and a radius r of each of the conductive patterns P1 and radii r of other adjacent conductive patterns P1 are equal. Here, some of the conductive patterns P1 are overlapped, and the other conductive patterns P1 are tangent to each other or one another. For instance, distances d1 to d3 from a central point O of the exemplary upper-left conductive pattern P1 to central points O1 to O3 of the other three conductive patterns P1 are incongruent. Thereby, the conductive patterns P1 are irregularly arranged. Similarly, with reference to FIG. 3B, in the embodiment shown therein, the conductive patterns P1 are circular rings with the same radius r. Here, some of the conductive patterns P1 are overlapped, and the other conductive patterns P1 are tangent to each other or one another. For instance, distances d1 to d3 from a central point O of the exemplary upper-left conductive pattern P1 to central points O1 to O3 of the other three conductive patterns P1 are incongruent. Thereby, the conductive patterns P1 are irregularly arranged.

Figure 3C:
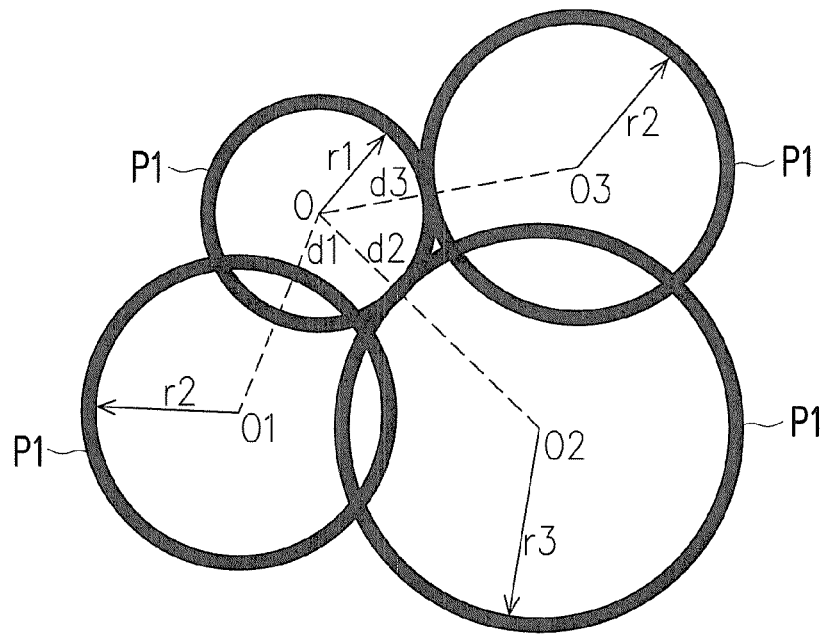
Figure 3D:
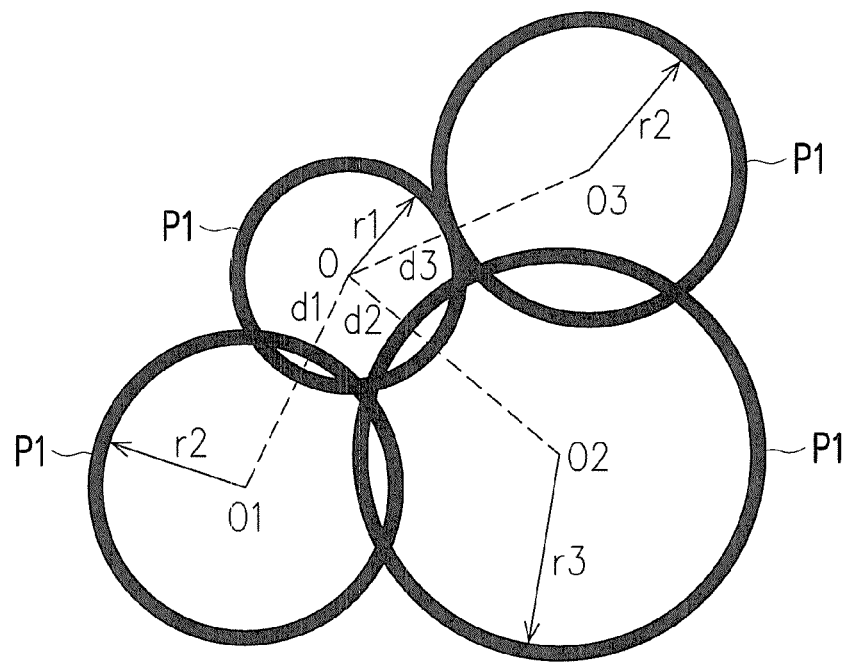

With reference to FIG. 3C, in the embodiment shown therein, the conductive patterns P1 are circular rings, and a radius of each of the conductive patterns P1 is different from at least one of the radii of other adjacent conductive patterns P1. Here, some of the conductive patterns P1 are overlapped, and the other conductive patterns P1 are tangent to each other or one another. For instance, the radius r1 of the exemplary upper-left conductive pattern P1 has the smallest value, and the radius r2 of each of the conductive patterns P1 at two respective sides of the exemplary upper-left conductive pattern P1 is equal and greater than the radius r1, and the radius r3 of the other conductive pattern P1 between the conductive patterns P1 having the same radius r2 has the largest value, i.e., r3>r2>r1; namely, the radii of the conductive patterns P1 are incongruent. Hence, the distances d1 to d3 from the central point O of the exemplary upper-left conductive pattern P1 to the central points O1 to O3 of the other three conductive patterns P1 are incongruent, and thus the conductive patterns P1 are irregularly arranged. With reference to FIG. 3D, in the embodiment shown therein, the conductive patterns P1 are circular rings having various radii. Here, some of the conductive patterns P1 are overlapped, and the other conductive patterns P1 are tangent to each other or one another. The radius r1 of the exemplary upper-left conductive pattern P1 has the smallest value, and the radius r2 of each of the conductive patterns P1 at two respective sides of the exemplary upper-left conductive pattern P1 is equal and greater than the radius r1, and the radius r3 of the other conductive pattern P1 between the conductive patterns P1 having the same radius r2 has the largest value. Hence, the distances d1 to d3 from the central point O of the exemplary upper-left conductive pattern P1 to the central points O1 to O3 of the other three conductive patterns P1 are incongruent, and thus the conductive patterns P1 are irregularly arranged.

Figure 4A:
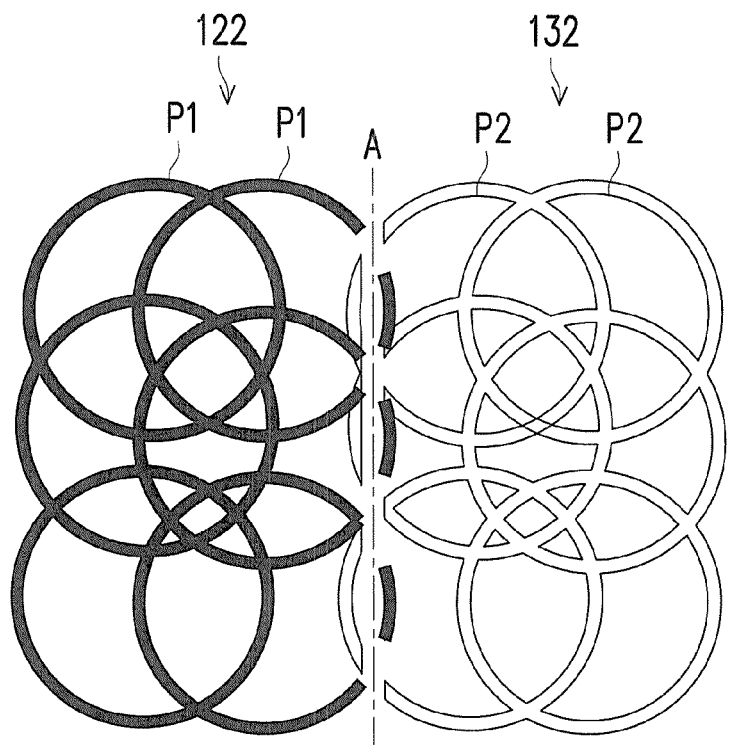
FIG. 4A and FIG. 4B are schematic views illustrating the mesh electrodes depicted in FIG. 1 according to several embodiments of the invention.
Figure 4B:
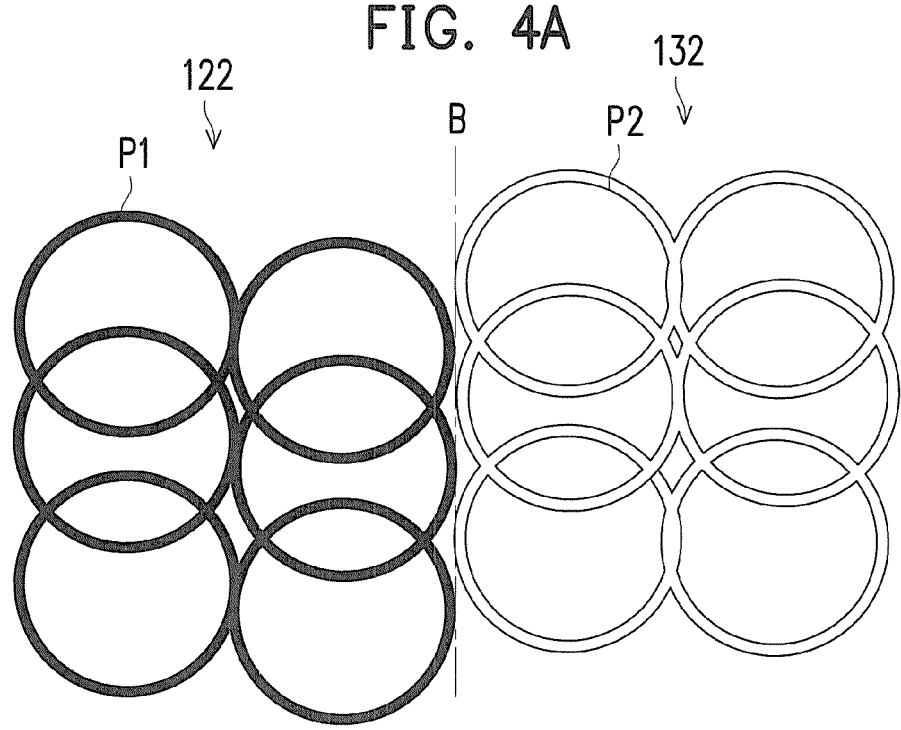

FIG. 4A and FIG. 4B are schematic views illustrating the mesh electrodes depicted in FIG. 1 according to several embodiments of the invention. According to the embodiment shown in FIG. 4A, the mesh electrodes 122 of each of the first conductive electrodes 120 are electrically insulated from the adjacent mesh electrodes 132 of the second conductive electrodes 130 through the conductive patterns P1 and P2 therebetween are cut off. Specifically, the conductive patterns P1 constituting the mesh electrodes 122 and the conductive patterns P2 constituting the mesh electrodes 132 may be one mesh pattern simultaneously formed on the first substrate 110 in one manufacturing step. The mesh pattern covers the entire surface of the first substrate 110 and subsequently becomes the mesh electrodes 122 and 132. Hence, the first conductive electrodes 120 and the second conductive electrodes 130 are located on the same surface of the first substrate 110. In order to electrically insulate the mesh electrodes 122 from the mesh electrodes 132, the conductive patterns P1 and P2 located between two adjacent mesh electrodes 122 and 132 provided in the embodiment shown in FIG. 4A are cut off along a dotted line A by laser etching or photolithography etching, for instance. Thereby, the corresponding locations of the mesh electrodes 122 and 132 need not be predetermined; instead, conductive patterns completely covering the first substrate 110 are formed in one manufacturing process, and the conductive patterns P1 and P2 respectively belonging to different mesh electrodes 122 and 132 are cut off, such that the mesh electrodes 122 are electrically insulated from the mesh electrodes 132. Here, the cut-off conductive patterns P1 and P2 are an arc-shaped line segment (e.g., the C-shaped conductive patterns P1 shown in FIG. 4A) electrically connected to other conductive patterns P1 or P2 in the same mesh electrode 122 or 132, while the other cut-off arc-shaped line segment is electrically insulated from the mesh electrode 122 or 132. Thereby, the first conductive electrodes 120 and the second conductive electrodes 130 located on the same surface of the first substrate 110 are electrically insulated, and the orthogonal projections of the mesh electrodes 122 and 132 on the first substrate 110 are not overlapped, such that the touch-sensing result of the touch panel 100 is not affected.

Similarly, in the embodiment shown in FIG. 4B, the mesh electrodes 122 of each of the first conductive electrodes 120 are electrically insulated from the adjacent mesh electrodes 132 of the second conductive electrodes 130 through the orthogonal projections of the conductive patterns P1 and P2 on the first substrate 110 are not overlapped. In particular, the conductive patterns P1 constituting the mesh electrodes 122 of each first conductive electrode 120 and the conductive patterns P2 constituting the mesh electrodes 132 of each second conductive electrode 130 may be simultaneously formed on the first substrate 110 by performing the same manufacturing process, while the areas where the mesh electrodes 122 and 132 are to be formed are predetermined. The areas where the mesh electrodes 122 are formed and where the mesh electrodes 132 are formed are separated along a dotted line B, such that the mesh electrodes 122 and 132 that are subsequently formed on the first substrate 110 are not in physical contact. Hence, when the mesh electrodes 122 and 132 are formed on the first substrate 110, the mesh electrodes 122 are electrically insulated from the mesh electrodes 132, and it is not necessary to additionally perform the cut-off process.

As discussed above, after the mesh pattern on the first substrate 110 becomes the electrically insulated mesh electrodes 122 and 132, the electrically insulated mesh electrodes 122 may be connected together by using the connection line 124 bridging and crossing the insulation pattern 140; thereby, the first conductive electrodes 120 and the second conductive electrodes 130 located on the same surface of the first substrate 110 are electrically insulated respectively, while the first conductive electrodes 120 are electrically connected, and the second conductive electrodes 130 are electrically connected. Here, the touch panel 100 may have a single-layered electrode structure (SITO), as shown in FIG. 2. Alternatively, the touch panel 100 may also be a one-layer solution (OLS) type touch panel (not shown), and the directions where the first conductive electrodes 120 and the second conductive electrodes 130 on the same surface of the first substrate 110 are arranged are not intersected. In addition, the first conductive electrodes 120 are electrically insulated from the second conductive electrodes 130; therefore, the insulation pattern and the connection lines are not required for connecting the mesh electrodes 122 or 132, and the touch-control function may still be provided by means of the variation in mutual capacitance between the first conductive electrodes 120 and the second conductive electrodes 130 or by means of the variation in self capacitance generated by the first/second conductive electrodes 120/130 and the reference potential. It is also likely for each aforesaid conductive electrode to include one single mesh electrode, each aforesaid conductive electrode may be electrically insulated from each other/one another, and the touch-control function may still be provided by means of the variation in self capacitance generated by the conductive electrodes and the reference potential. According to the present embodiment, the first substrate 110 may be a glass substrate, a plastic substrate, a thin film substrate, a composite substrate containing glass and plastic, or a cover plate, and the cover plate may include a glass cover plate, a plastic cover plate, or any other cover plate made of a material with high mechanical strength and capable of performing functions of protecting, covering, or embellishing the corresponding device. Note that the material of the first substrate 110 is not limited herein. The first substrate 110 may also be a substrate of a display, and the first conductive electrodes 120 and the second conductive electrodes 130 and a display medium layer of the display may be located at two respective sides of the first substrate 110; alternatively, the first conductive electrodes 120 and the second conductive electrodes 130 may be located between the display medium layer and the first substrate 110. As such, the touch panel may be integrated with the display to form a touch display panel.

Figure 5:
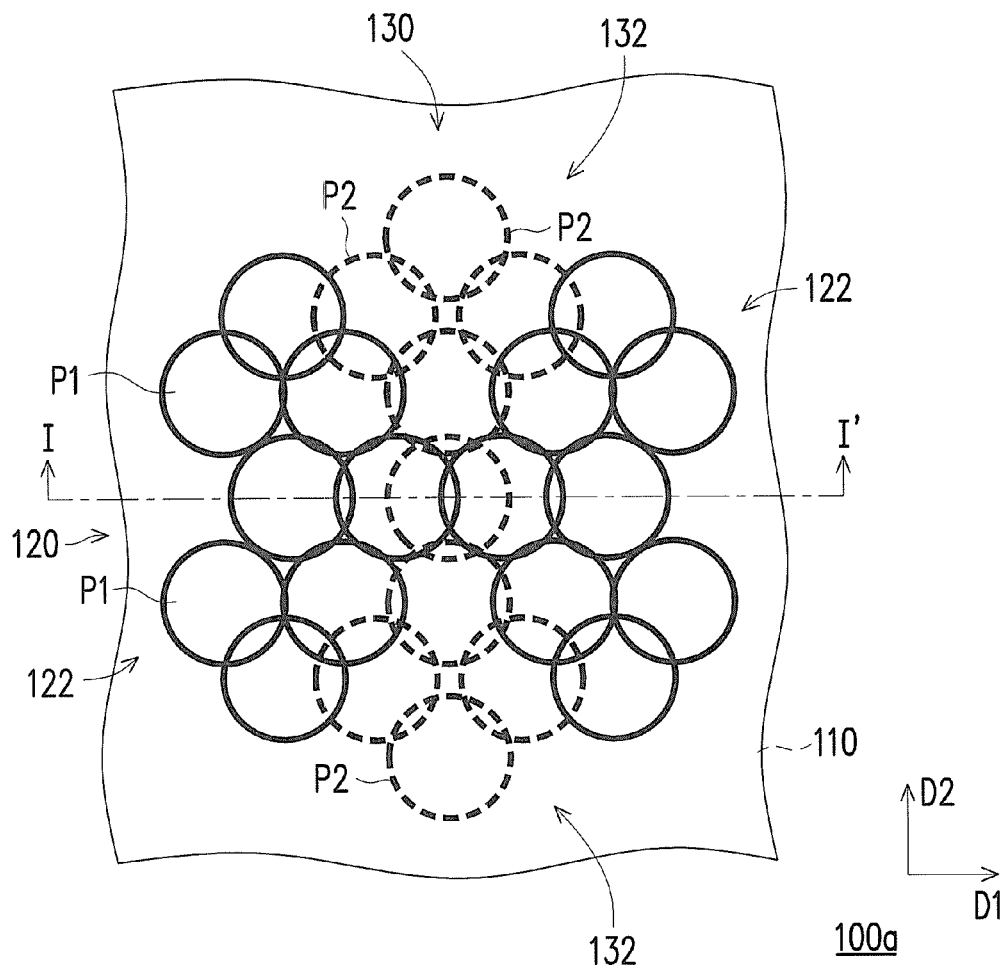
FIG. 5 is a schematic view illustrating a touch panel according to another embodiment of the invention.
Figure 6:
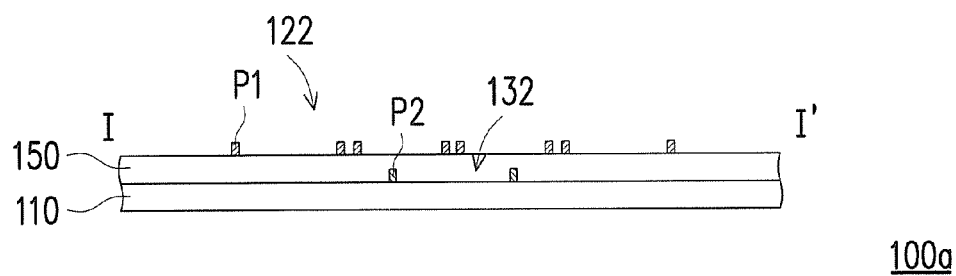
FIG. 6 is a cross-sectional view illustrating the touch panel depicted in FIG. 5 along a line I-I'.

FIG. 5 is a schematic view illustrating a touch panel according to another embodiment of the invention. FIG. 6 is a cross-sectional view illustrating the touch panel depicted in FIG. 5 along a line I-I'. With reference to FIG. 5 and FIG. 6, in the present embodiment, the touch panel 100a includes a first substrate 110, a plurality of first conductive electrodes 120, and a plurality of second conductive electrodes 130. The detailed descriptions of the first substrate 110, the first conductive electrodes 120, and the second conductive electrodes 130 may be referred to as those provided in the previous embodiment and thus will not be further given hereinafter. The difference between the touch panel 100a and the touch panel 100 provided above mainly lies in that the touch panel 100a further includes an insulation layer 150 located between the first conductive electrodes 120 and the second conductive electrodes 130. Particularly, the second conductive electrodes 130 described herein are located on one surface of the first substrate 110, and the insulation layer 150 is located on the first substrate 110 and covers the second conductive electrodes 130. The first conductive electrodes 120 are located on the insulation layer 150, and the first conductive electrodes 120 and the second conductive electrodes 130 are located on different planes. Since the insulation layer 140 is located between the first conductive electrodes 120 and the second conductive electrodes 130, the mesh electrodes 122 of the first conductive electrodes 120 may be electrically insulated from the mesh electrodes 132 of the second conductive electrodes 130. Besides, the first substrate 110 described herein may be a glass substrate, a plastic substrate, a thin film substrate, or a composite substrate containing glass and plastic, and the material of the first substrate 110 is not limited herein.

In addition, the first conductive electrodes 120 and the second conductive electrodes 130 shown in FIG. 5 and FIG. 6 are located the same side of the first substrate 110, which should not be construed as a limitation to the invention. In other embodiments of the invention, the first conductive electrodes 120 and the second conductive electrodes 130 may also be located at two respective sides of the first substrate 110 and may be arranged on different planes, such that the mesh electrodes 122 of the first conductive electrodes 120 may be electrically insulated from the mesh electrodes 132 of the second conductive electrodes 130 directly without using insulation pattern 140 and insulation layer 150.

Figure 7:
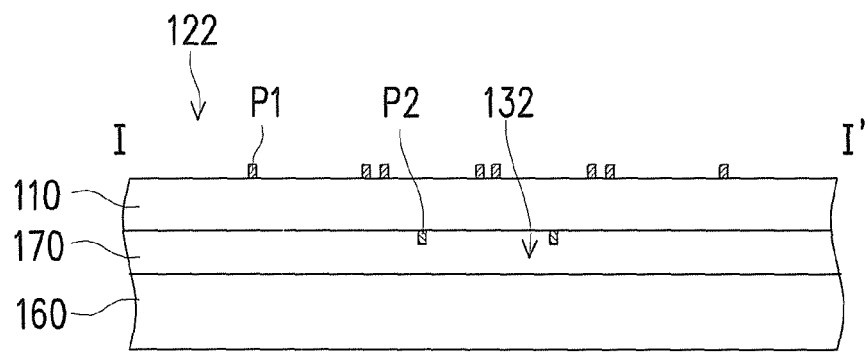
FIG. 7 to FIG. 10 are cross-sectional views illustrating a touch panel according to other embodiments of the invention.

FIG. 7 to FIG. 10 are cross-sectional views illustrating a touch panel according to other embodiments of the invention. With reference to FIG. 5 and FIG. 7, specifically, the top view of a touch panel 100b in the present embodiment may be referred to as that shown in FIG. 5, and the difference between the touch panel 100b and the touch panel 100a depicted in FIG. 6 lies in that the first conductive electrodes 120 and the second conductive electrodes 130 in the touch panel 100b are located at two respective sides of the first substrate 110. In particular, the first conductive electrodes 120 and the second conductive electrodes 130 described herein are located at two respective surfaces of the first substrate 110, and the first substrate 110 may be a glass substrate, a plastic substrate, a thin film substrate, or a composite substrate containing glass and plastic. Besides, the touch panel 100b further includes a second substrate 160 and an adhesive layer 170. The second substrate 160 is located on one side of the first substrate 110 and faces the second conductive electrodes 130. The adhesive layer 170 is located between the first substrate 110 and the second substrate 160. Here, the second substrate 160 may be a cover plate that may be adhered to the first substrate 110 by means of an optical adhesive (i.e., the adhesive layer 170) and cover the second conductive electrodes 130. Here, the cover plate may be a glass cover plate, a plastic cover plate, or any other cover plate made of a material with high mechanical strength and capable of performing functions of protecting, covering, or embellishing the corresponding device. Note that the types and the materials of the first substrate 110, the second substrate 160, and the adhesive layer 170 are not limited herein.

Figure 8:
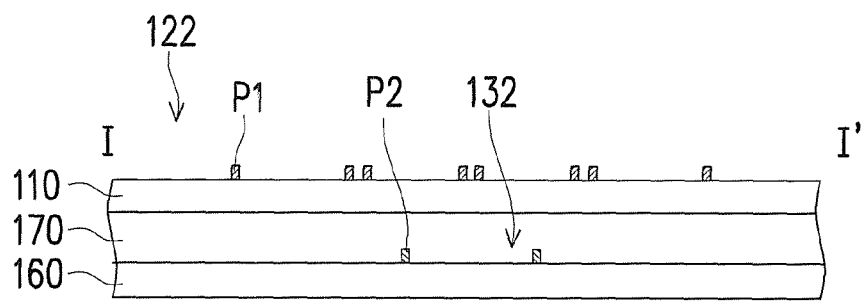

With reference to FIG. 5 and FIG. 8, specifically, the top view of a touch panel 100c in the present embodiment may be referred to as that shown in FIG. 5, and the touch panel 100c and the touch panel 100b depicted in FIG. 7 are arranged in a similar manner. The difference between the touch panel 100c and the touch panel 100b lies in that the first conductive electrodes 120 and the second conductive electrodes 130 in the touch panel 100c described herein are located on different substrates. In particular, according to the present embodiment, the first conductive electrodes 120 are located on one surface of the first substrate 110; the second conductive electrodes 130 are located on one surface of the second substrate 160 facing the other surface of the first substrate 110 where the first conductive electrodes 120 are not located. That is, in the present embodiment, the first conductive electrodes 120 and the second conductive electrodes 130 may be respectively formed on the first substrate 110 and the second substrate 160 and may then be adhered together by means of the adhesive layer 170 (e.g., an optical adhesive). According to another embodiment of the invention, the first conductive electrodes 120 and the second conductive electrodes 130 may also be respectively located on the first substrate 110 and the second substrate 160 in a face-to-face manner. Here, the first substrate 110 and second substrate 160 may be glass substrates, plastic substrates, thin film substrates, or composite substrates containing glass and plastic; the second substrate 160 is also likely to be a cover plate, e.g., a glass cover plate, a plastic cover plate, or any other cover plate made of a material with high mechanical strength and capable of performing functions of protecting, covering, or embellishing the corresponding device. Note that the types and the materials of the first substrate 110, the second substrate 160, and the adhesive layer 170 are not limited herein.

Figure 9:
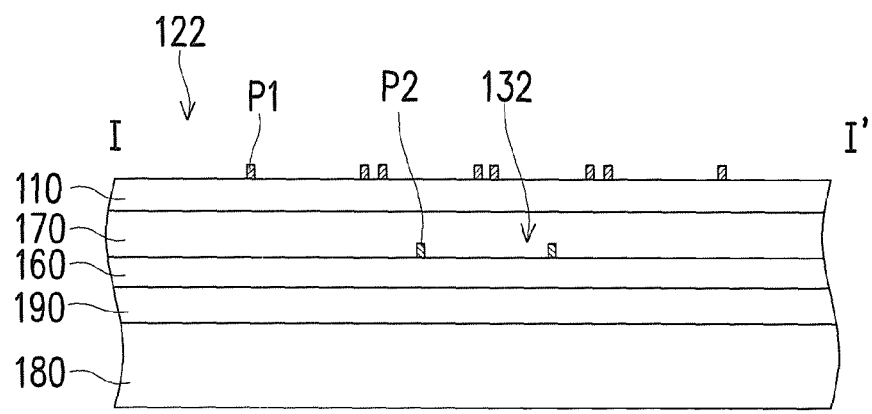
Figure 10:
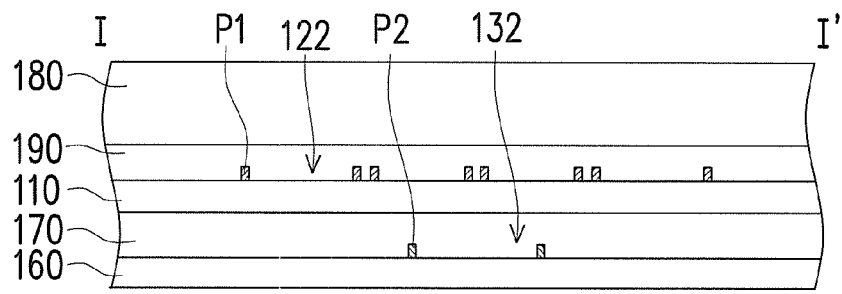

With reference to FIG. 5 and FIG. 9, specifically, the top view of a touch panel 100d in the present embodiment may be referred to as that shown in FIG. 5, and the touch panel 100d and the touch panel 100c depicted in FIG. 8 are arranged in a similar manner. The difference between the touch panel 100d and the touch panel 100c lies in that the touch panel 100d described herein further includes a third substrate 180 and another adhesive layer 190. The third substrate 180 is located on one side of the second substrate 160 opposite to the first substrate 110, while the first substrate 110 is located on the other side of the second substrate 160, i.e., the second substrate 160 is located between the first substrate 110 and the third substrate 180. The adhesive layer 190 is located between the third substrate 180 and the second substrate 160. Namely, the third substrate 180 is adhered to the second substrate 160 by means of the adhesive layer 190 (e.g., an optical adhesive). However, in another embodiment of the invention, the third substrate 180 may be located on one side of the first substrate 110 opposite to the second substrate 160, while the second substrate 160 is located on the other side of the first substrate 110, i.e., the first substrate 110 is located between the second substrate 160 and the third substrate 180. With reference to FIG. 5 and FIG. 10, in the present embodiment, the third substrate 160 of the touch panel 100e is adhered to one side of the first substrate 110 by means of the adhesive layer 190, and the second substrate 160 is located on the other side of the first substrate 110, such that the adhesive layer 190 is located between the third substrate 180 and the first substrate 110, and that the adhesive layer 190 covers the mesh electrodes 122 of the first conductive electrodes 120. In the embodiment shown in FIG. 9 and FIG. 10, the first substrate 110 and the second substrate 160 may be glass substrates, plastic substrates, thin film substrates, or composite substrates containing glass and plastic; the third substrate 180 may be a cover plate, e.g., a glass cover plate, a plastic cover plate, or any other cover plate made of a material with high mechanical strength and capable of performing functions of protecting, covering, or embellishing the corresponding device. Note that the types and the materials of the first substrate 110, the second substrate 160, the third substrate 180, and the adhesive layers 170 and 190 are not limited herein.

In the touch panels 100a to 100e, the first conductive electrodes 120 and the second conductive electrodes 130 are located at two respective sides of the insulation layer 150 or at two respective sides of the first substrate 110 and thus should be formed in different steps. Besides, since the first conductive electrodes 120 and the second conductive electrodes 130 described in these embodiments are not coplanar, the mesh electrodes 122 of the first conductive electrodes 120 and the mesh electrodes 132 of the second conductive electrodes 130 are electrically insulated without intentionally placing the first conductive electrodes 120 not in physical contact with the second conductive electrodes 130 nor performing the cut-off process. In these present embodiments, the conductive patterns P1 and P2 of the mesh electrodes 122 and 132 are irregularly arranged, and the sides of the adjacent first conductive electrodes 120 and the adjacent second conductive electrodes 130 may be partially overlapped; however, the overlapping portion does not pose a significant impact on the touch-sensing result of the touch panels 100a to 100e. If the touch-sensing result or the visual effects are further improved, the problem of the overlapping portion may be rectified while or after the first conductive electrodes 120 and the second conductive electrodes 130 are formed.

Figure 11:
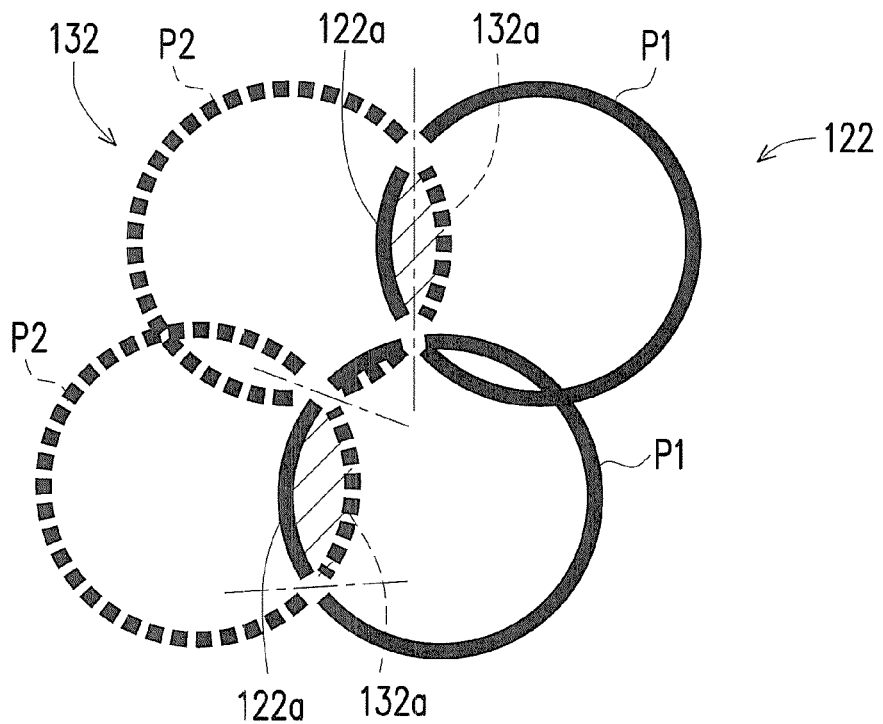
FIG. 11 is a partial enlarged view illustrating the touch panel depicted in FIG. 5.

FIG. 11 is a partial enlarged view illustrating the touch panel depicted in FIG. 5. With reference to FIG. 5 and FIG. 11, in the present embodiment, an orthogonal projection of a portion surrounded by each mesh electrode 122 of each first conductive electrode 120 on the first substrate 110 and an orthogonal projection of a portion surrounded by each mesh electrode 132 of each adjacent second conductive electrode 130 on the first substrate 110 has an overlapping portion shown as region with oblique lines in FIG. 11. Specifically, FIG. 11 merely illustrates the right mesh electrode 122 and the top mesh electrode 132 in FIG. 5, and FIG. 11 only depicts parts of the overlapping portion corresponding to the mesh electrodes 122 and 132. According to the present embodiment, an orthogonal projection of each of the mesh electrodes 122 on the first substrate 110 is overlapped with an orthogonal projection of the adjacent mesh electrode 132 on the first substrate 110, and each of the conductive patterns P1 and P2 adjacent to the overlapping portion is an arc-shaped line segment, e.g., the conductive patterns P1 and P2 respectively at the right-hand and left-hand sides in FIG. 11. At this time, the conductive patterns P1 in form of the arc-shaped line segment are electrically connected to other conductive patterns P1 in form of circular rings in the same mesh electrodes 122, and the conductive patterns P2 in form of the arc-shaped line segment are electrically connected to other conductive patterns P2 in form of circular rings in the same mesh electrode 132, so as to respectively form the mesh electrodes 122 and 132.

That is, in order to prevent the touch-sensing result from being affected by the overlapped orthogonal projections of the mesh electrodes 122 and the adjacent mesh electrodes 132 on the first substrate 110, the conductive patterns P1 and P2 adjacent to the overlapping portion are designed to be in form of the arc-shaped line segment. The arc-shaped conductive patterns P1 and P2 are located at the side of the overlapping portion, and the orthogonal projections of the arc-shaped conductive patterns P1 and P2 on the first substrate 110 are not overlapped with each other. Since the conductive parts of each mesh electrode 122 include the central conductive patterns P1 in form of the circular rings and the arc-shaped conductive patters P1 located at the side thereof, and the conductive parts of each mesh electrode 132 include the central conductive patterns P2 in form of the circular rings and the arc-shaped conductive patters P2 located at the side thereof, the orthogonal projections of the conductive parts of the mesh electrodes 122 on the first substrate 110 may be prevented from being overlapped with the orthogonal projections of the conductive parts of the adjacent mesh electrodes 132 on the first substrate 110, and thereby the touch-sensing result is not affected.

Moreover, in the present embodiment, the mesh electrodes 122 corresponding to the overlapping portion further include a plurality of dummy line segments 122a located on one side of the arc-shaped conductive patterns P1 corresponding to the overlapping portion, and the dummy line segments 122a and the arc-shaped conductive patterns P1 correspondingly constitute a plurality of circular rings. Besides, the mesh electrodes 132 corresponding to the overlapping portion further include a plurality of dummy line segments 132a located on one side of the arc-shaped conductive patterns P2 corresponding to the overlapping portion, and the dummy line segments 132a and the arc-shaped conductive patterns P2 correspondingly constitute a plurality of circular rings. Specifically, the conductive patterns P1 constituting the mesh electrodes 122 and the conductive patterns P2 constituting the mesh electrodes 132 may be designed to have the same shape, so as to simplify the manufacturing process. During the manufacturing process, the conductive patterns P1 constituting the mesh electrodes 122 and the conductive patterns P2 constituting the mesh electrodes 132 are circular rings, and the interlaced circular rings of the mesh electrodes 122 and 132 are electrically connected. Similar to the above, in order to prevent the touch-sensing result from being affected by the overlapped orthogonal projections of the mesh electrodes 122 and the adjacent mesh electrodes 132 on the first substrate 110, the circular rings corresponding to the overlapping portion of the mesh electrodes 122 and 132 may be cut off along the dotted line shown in FIG. 11, such that the conductive patterns P1 and P2 corresponding to the overlapping portion are in form of arc-shaped line segment, as discussed above, and that the orthogonal projections of the conductive parts of the mesh electrodes 122 on the first substrate 110 may be prevented from being overlapped with the orthogonal projections of the conductive parts of the adjacent mesh electrodes 132 on the first substrate 110. At this time, the other part of the cut-off circular rings, i.e., the dummy line segments 122a and 132a, is selectively left on the first substrate 110 and is not removed. Since the dummy line segments 122a and 132a are electrically insulated from the corresponding conductive patterns P1 and P2, the touch-sensing result is not affected even though the dummy line segments 122a and 132a are left in the overlapping portion. Preferably, if the dummy line segments 122a and 132a are left on the first substrate 110, the profile of the circular rings may be maintained due to the dummy line segments 122a and 132a and the corresponding conductive patterns P1 and P2, such that the touch panel 100a may have favorable visual effects.

In the previous embodiments, the conductive electrodes are located on the surface of the substrate, while the conductive electrodes are not required to be in direct contact with the surface of the substrate; as a matter of fact, other film layers that are not shown in the drawings may be located between the conductive electrodes and the surface of the substrate according to actual requirements, and the invention is not limited thereto.

To sum up, the conductive electrodes of the touch panel described herein are constituted by the mesh electrodes connected together. Each of the mesh electrodes includes a plurality of conductive patterns, the radii of the conductive patterns of the mesh electrodes may be different, and the conductive patterns are overlapped or tangent to each other/one another. Each of the conductive patterns has a central point, and distances from the central point of each of the conductive patterns to the central points of adjacent conductive patterns are incongruent, such that the conductive patterns are arranged in an irregular manner. Accordingly, when the touch panel described herein is applied to a display device, the pale and dark lines occur by the irregularly arranged conductive patterns of the touch panel overlapping with the pixel structure (having the specific period) in the display device would be decreased, so as to prevent the effect of moire occurred in the display device. In conclusion, the touch panel described herein may not be subject to the problem of moire.

Although the invention has been described with reference to the above exemplary embodiments, it will be apparent to one of ordinary skill in the art that modifications to the described exemplary embodiments may be made without departing from the spirit of the invention. Accordingly, the scope of the invention will be defined by the attached claims and not by the above detailed descriptions.

What is claimed is:
1. A touch panel comprising:
a first substrate; and
a plurality of conductive electrodes located at the first substrate, each of the
conductive electrodes comprising at least one of mesh electrodes, each of the mesh
electrodes comprising a plurality of conductive patterns, and the conductive patterns of
the same mesh electrode being connected together, each of the conductive patterns
having a central point, wherein distances from the central point of each of the
conductive patterns to the central points of other adjacent conductive patterns are
incongruent, such that the conductive patterns are arranged in an irregular manner;
the conductive electrodes further comprise:
a plurality of first conductive electrodes located on the first substrate, each of the first conductive electrodes comprising the mesh electrodes arranged along a first direction and connected together; and
a plurality of second conductive electrodes located on the first substrate, each of the second conductive electrodes comprising the mesh electrodes arranged along a second direction and connected together, wherein the mesh electrodes of the first conductive electrodes are electrically insulated from the mesh electrodes of the second conductive electrodes;
wherein an orthogonal projection of each of the mesh electrodes of each of the first conductive electrodes on the first substrate and an orthogonal projection of the adjacent one of the mesh electrodes of one of the second conductive electrodes on the first substrate has an overlapping portion, and each of the conductive patterns adjacent to the overlapping portion is an arc-shaped line segment;

wherein the mesh electrodes corresponding to the overlapping portion further comprise a plurality of dummy line segments located on one side of the conductive patterns corresponding to the overlapping portion, and the dummy line segments and the conductive patterns correspondingly constitute a plurality of circular rings.

2. The touch panel as recited in claim 1, wherein each of the conductive patterns is a circular ring or an arc-shaped line segment.

3. The touch panel as recited in claim 2, wherein the conductive patterns are overlapped or tangent to each other or one another.

4. The touch panel as recited in claim 2, wherein a radius of each of the conductive patterns and radii of other adjacent conductive patterns are equal.

5. The touch panel as recited in claim 3, wherein a radius of each of the conductive patterns is different from at least one of radii of other adjacent conductive patterns.

6. The touch panel as recited in claim 1, wherein the mesh electrodes of each of the first conductive electrodes are electrically insulated from the adjacent mesh electrodes of the second conductive electrodes through the conductive patterns therebetween which are cut off.

7. The touch panel as recited in claim 1, wherein the first conductive electrodes and the second conductive electrodes are located on the same side of the first substrate.

8. The touch panel as recited in claim 7, wherein the first conductive electrodes and the second conductive electrodes are located on the same surface of the first substrate, and the first conductive electrodes are electrically insulated from the second conductive electrodes.

9. The touch panel as recited in claim 8, further comprising:
an insulation pattern, wherein the mesh electrodes arranged in the same direction are
electrically insulated, a connection line between any two adjacent mesh electrodes of
the mesh electrodes connects two adjacent mesh electrodes along the same direction, the
insulation pattern is located between the first conductive electrodes and second
conductive electrodes, and the connection line is located on the insulation pattern and connected to the mesh electrodes arranged in the same direction.

10. The touch panel as recited in claim 9, wherein the connection line is a linear connection line or a chain-shaped connection line constituted by a plurality of conductive patterns connected together.

11. The touch panel as recited in claim 7, further comprising:
an insulation layer located between the first conductive electrodes and the second conductive electrodes.

12. The touch panel as recited in claim 1, wherein the first conductive electrodes and the second conductive electrodes are located on two respective sides of the first substrate.

13. The touch panel as recited in claim 12, further comprising:
a second substrate located on one side of the first substrate, wherein the first
conductive electrodes and the second conductive electrodes are located on two respective surfaces of the first substrate; and
an adhesive layer located between the first substrate and the second substrate.

14. The touch panel as recited in claim 12, further comprising:
a second substrate located on one side of the first substrate, wherein the first
conductive electrodes are located on one surface of the first substrate, the second
conductive electrodes are located on one surface of the second substrate facing the other
surface of the first substrate where the first conductive electrodes are not located; and
an adhesive layer located between the first substrate and the second substrate.

15. The touch panel as recited in claim 14, further comprising:
a third substrate located on one side of the second substrate opposite to the first substrate; and
an adhesive layer located between the third substrate and the second substrate.

16. The touch panel as recited in claim 14, further comprising:
a third substrate located on one side of the first substrate opposite to the second substrate; and
an adhesive layer located between the third substrate and the first substrate.

17. The touch panel as recited in claim 1, wherein a material of the conductive patterns comprises conductive metal, conductive ink, carbon nano-tubes, grapheme, metal nano-particles, metal nano-wires, or a combination thereof.

18. The touch panel as recited in claim 1, wherein a wire width of each of the conductive patterns is within a range from 0.5 micrometers to 20 micrometers.

19. The touch panel as recited in claim 1, wherein the first substrate is a substrate of a display.

* * * * *